United States Patent
Karlsson et al.

(10) Patent No.: US 9,412,705 B2
(45) Date of Patent: *Aug. 9, 2016

(54) SHORT CIRCUIT REDUCTION IN A FERROELECTRIC MEMORY CELL COMPRISING A STACK OF LAYERS ARRANGED ON A FLEXIBLE SUBSTRATE

(75) Inventors: Christer Karlsson, Linköping (SE); Olle Jonny Hagel, Linköping (SE); Jakob Nilsson, Linköping (SE); Per Bröms, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 150 days.

This patent is subject to a terminal disclaimer.

(21) Appl. No.: 14/128,011

(22) PCT Filed: Jun. 27, 2011

(86) PCT No.: PCT/EP2011/060740
§ 371 (c)(1),
(2), (4) Date: Apr. 10, 2014

(87) PCT Pub. No.: WO2013/000501
PCT Pub. Date: Jan. 3, 2013

(65) Prior Publication Data
US 2014/0210026 A1    Jul. 31, 2014

(51) Int. Cl.
*H01L 23/00* (2006.01)
*G11B 9/02* (2006.01)
(Continued)

(52) U.S. Cl.
CPC ............... *H01L 23/562* (2013.01); *G11B 9/02* (2013.01); *G11C 11/161* (2013.01); *H01L 27/11502* (2013.01); *H01L 27/1203* (2013.01); *H01L 28/55* (2013.01); *H01L 43/02* (2013.01); *H01L 43/12* (2013.01); *H01L 51/0591* (2013.01); *G11C 11/22* (2013.01); *H01L 2924/0002* (2013.01)

(58) Field of Classification Search
CPC ............ H01L 23/562; H01L 27/11502; H01L 51/0591
See application file for complete search history.

(56) References Cited

U.S. PATENT DOCUMENTS

| 6,611,014 B1 | 8/2003 | Kanaya et al. |
| 2008/0122051 A1 | 5/2008 | Theuss |

(Continued)

FOREIGN PATENT DOCUMENTS

| EP | 1659621 A1 | 5/2006 |
| JP | 200954785 A | 3/2009 |

(Continued)

OTHER PUBLICATIONS

Jonghyun Rho, et al., PbZrxTi1-xO3 Ferroelectric Thin-Film Capacitors for Flexible Nonvolatile Memory Applications, IEEE Electron Device Letters, Sep. 2010, pp. 1017-1019, vol. 31, No. 9.

*Primary Examiner* — Daniel Whalen
(74) *Attorney, Agent, or Firm* — Steven B. Phillips; Moore & Van Allen PLLC

(57) ABSTRACT

A ferroelectric memory cell (1) and a memory device (100) comprising one or more such cells (1). The ferroelectric memory cell comprises a stack (4) of layers arranged on a flexible substrate (3). Said stack comprises an electrically active part (4a) and a protective layer (11) for protecting the electrically active part against scratches and abrasion. Said electrically active part comprises a bottom electrode layer (5) and a top electrode layer (9) and at least one ferroelectric memory material layer (7) between said electrodes. The stack further comprises a buffer layer (13) arranged between the top electrode layer (9) and the protective layer (11). The buffer layer (13) is adapted for at least partially absorbing a lateral dimensional change (ΔL) occurring in the protective layer (11) and thus preventing said dimensional change (ΔL) from being transferred to the electrically active part (4a), thereby reducing the risk of short circuit to occur between the electrodes.

13 Claims, 4 Drawing Sheets

(51) Int. Cl.
*H01L 27/115* (2006.01)
*H01L 51/05* (2006.01)
*H01L 27/12* (2006.01)
*H01L 49/02* (2006.01)
*G11C 11/16* (2006.01)
*H01L 43/02* (2006.01)
*H01L 43/12* (2006.01)
*G11C 11/22* (2006.01)

(56) References Cited

U.S. PATENT DOCUMENTS

| | | | |
|---|---|---|---|
| 2009/0189152 A1* | 7/2009 | Cho | B82Y 10/00 257/40 |
| 2009/0224301 A1 | 9/2009 | Yamakawa et al. | |
| 2009/0315456 A1 | 12/2009 | Furukawa et al. | |
| 2010/0148127 A1 | 6/2010 | Ellinger et al. | |
| 2010/0187584 A1 | 7/2010 | Matsuda | |
| 2014/0216791 A1* | 8/2014 | Karlsson | G11C 11/22 174/254 |

FOREIGN PATENT DOCUMENTS

| | | | |
|---|---|---|---|
| JP | 2009054785 A | * | 3/2009 |
| JP | 2010198957 A | | 9/2010 |
| KR | 20100019734 A | | 2/2010 |
| WO | 2004042780 A2 | | 5/2004 |
| WO | 2006071122 A1 | | 7/2006 |
| WO | 2006135246 A1 | | 12/2006 |
| WO | 2007000695 A2 | | 1/2007 |
| WO | 2008065927 A1 | | 6/2008 |

* cited by examiner

SHORT CIRCUIT REDUCTION IN A FERROELECTRIC MEMORY CELL COMPRISING A STACK OF LAYERS ARRANGED ON A FLEXIBLE SUBSTRATE

TECHNICAL FIELD

The present disclosure relates generally to a ferroelectric memory cell comprising a stack of layers arranged on a flexible substrate, wherein said stack comprises an electrically active part and a protective layer for protecting the electrically active part against scratches and abrasion, and wherein said electrically active part comprises a bottom electrode layer and a top electrode layer and at least one ferroelectric memory material layer separating said electrodes.

TECHNICAL BACKGROUND

Conventionally, ferroelectric memory cells are typically provided on rigid substrates, such as silicon. However, electronics become increasingly used also in non-conventional application areas and new technologies emerge for producing electronics, where use of flexible substrates is desirable or even required. This is for example the case for printed electronics, where use of a flexible substrate may be desirable or even required from manufacturing, application area, and/or cost perspectives.

Printed electronics may replace conventional electronics in case of very simple components, which can be realized less expensive by printing technologies; however, the aim is typically new application areas where conventional electronics are not suitable for technological or cost reasons. Applications for printed electronics involve, for example, tags and labels in which information can be stored. In such applications, and in principle in any electronic device, availability of memory components is crucial.

The present applicant has presented a memory technology that can be realized by printing processes, which e.g. is described in WO2006/135246. The memory is based on a ferroelectric material as the memory substance, in particular a ferroelectric polymeric material. Memory materials of this kind has proven to be rewritable and bistable over prolonged periods of time. Each memory cell is a capacitor-like structure where the memory material is located between a pair of electrodes and where the memory cell is accessed via conductors linking the electrodes to electronic driver or detection circuitry. The latter may e.g. be located on the periphery of the memory array or on a separate module. Depending on the application, memory device may contain from one individual memory cell and up to several millions of cells arranged in matrix arrays. Some basic cell architectures and array arrangements are schematically shown in FIGS. 1a-d. It may be noted that the substrate is not shown, only the electrically active part of the memory cells. Each cell can be viewed upon as a sequence, or stack, of layers arranged on the flexible substrate, the stack involving at least one electrically active part comprising two electrode layers (top and bottom) with a layer of the (insulating) memory material arranged in-between.

When fabricating ferroelectric memory cells of capacitor type it is evidently important to avoid shorts through the memory cells. Shorts are here defined by a conducting or low resistance path, compared to a desired normal situation, from one of the electrodes to the other electrode. The short circuits are detrimental to the memory cell function as they can both hide the data content of a memory cell and also deteriorate the writing of data into the memory device. The problem with shorts is typically greater when the memory material layer between the electrodes is thin. However, the thickness of the memory layer and drive voltage are typically proportional to each other, and in order to meet up with low voltage requirements, there is often no other option than using a thin memory layer. Manufacturing will always lead to some extent of memory cells being short circuited or more prone to be short circuited. It is desirable to reduce the risk of short circuits to occur.

Furthermore, printed electronic devices or components typically need to be protected against external influences, such as physical damage, but it is typically not possible, nor desirable with protection by e.g. encapsulation as in conventional electronics. Instead a desirable type of protection is an outer protective layer terminating the stack and that adds protection by e.g. providing scratch and abrasion resistance and resistance against detrimental environmental influence. A protective layer of this kind can be provided as a global layer covering multiple memory cells, e.g. by completely covering a printed memory device. Such protective layer typically need to be hard and relatively thick, such as in a range of 2-20 micrometers, and it is often suitable and desirable to use a material that can be deposited as layer in a fluid state and then hardened, e.g. by using a UV curable varnish as the protection layer.

SUMMARY OF THE INVENTION

In view of the above, an object of this disclosure is to present a solution overcoming or at least alleviating problems in the prior art, or to at least present an alternative solution. A more specific object is to provide a solution that enables reduction of the number of shorts that may occur in memory cells of the above described type, that is, memory cells comprising a stack of layers arranged on a flexible substrate, where said stack comprises a bottom electrode layer and a top electrode layer separated by an organic memory material and where the stack is terminated by a protective layer.

The invention is defined by the appended independent claims.

From extensive testing and investigation of memory devices and cells of the above described type, in particular such realized as printed electronics, the applicant has, among other things, found that use of a protective layer that is hardened after deposition, increases the risk of shorts to occur.

Although there is no wish to be bound by a particular theory of underlying causes to the observed phenomena, one explanation may be dimensional change, such as shrinking, of the protective layer resulting from the hardening. Although commercially available materials, as known by the skilled person, for provision of such protective layers often strive towards as low dimensional change as possible and may reach as low as only about 1% change in size, it may be extremely hard, if at all possible, to totally avoid dimensional change in such layers. By the adhesion of the protective layer to the underlying stack, the dimensional change transforms into lateral forces acting upon and stressing the underlying layers, including the memory cell. In order to be flexible, a flexible substrate apparently has to be thinner than a rigid-substrate if they are made of the same material, or, be made of a softer material (e.g. by having a lower glass transition temperature $T_g$) if made of different material than a rigid substrate of same thickness. In both cases it is understood that the flexible substrate contributes with less resistance to lateral forces than a rigid substrate, whereby the layers of the memory cell will be subject to greater stress. The problem may be particular prominent when lateral dimensions of a memory cell, typically defined by the lateral dimension of electrode crossings of a memory cell, are magnitudes greater than the thickness of the layers, since then already a few percentage of lateral dimensional change may correspond to a vertical "through layer" dimensional change that in size is greater than the thickness of the memory layer. Such ratios, i.e. when lateral dimensions of a memory cell are magnitudes greater than the vertical dimension, are typically the case for printed memory cells. Also, the force resulting from the dimensional change of the protective layer and that act on the rest of the stack through the adhesion of the protective layer, typically increases with the thickness of the protective layer, and, since the protective layer often has to have a thickness that is magnitudes greater than the thickness of electrically active part of the memory cell (the electrodes and the memory layer), and often in the same order of size as the substrate thickness, it may be particular difficult for these layers and the substrate to resist such force. For example, a printed memory cell may have electrode and memory layers that have thicknesses that are fractions of a micrometer, the thicknesses of the protective layer and the substrate may be many micrometers thick, and the lateral dimensions of the memory cell more than hundred micrometers. When the memory film and/or the electrodes, owing to the use of flexible substrate, to a greater extent become loaded by forces caused by dimensional change in the protective layer, the risk increases that these layers deform, locally crack and/or that the topography increase, the result in any case being increased risk that protruding parts or fragments of the electrodes penetrates the memory material and cause short circuit or that small fragments or structures are formed where the electric field strength will be so high when the memory cell is electrically operated that there literally will be microscopic explosions in the memory cell, resulting in short circuit.

Hence, according to a first aspect there is provided a ferroelectric memory cell comprising a stack of layers arranged on a flexible substrate, wherein said stack comprises an electrically active part and a protective layer for protecting the electrically active part against scratches and abrasion. Said electrically active part comprises a bottom electrode layer, a top electrode layer and at least one ferroelectric memory material layer between said electrode layers. The stack further comprises a buffer layer arranged between the top electrode layer and the protective layer, the buffer layer being adapted for at least partially absorbing a lateral dimensional change occurring in the protective layer and thus preventing said dimensional change from being transferred to the electrically active part.

In view of the above, by the absorption of lateral dimensional change, the electrically active part is to a reduced extent exposed to forces caused by the lateral dimensional change, e.g. caused by shrinkage during curing, of the protective layer, and thus the risk for deformations in the electrically active part is reduced and by that the risk of short circuit is reduced as well.

By "short circuit" is here meant a conducting or low resistance path, compared to a desired normal situation, from one electrode to the other electrode, which is detrimental to the functioning of the ferroelectric memory cell.

By "electrically active part" is here meant the parts of the stack providing the electrical function of the electrical component. The protective layer and the buffer layer are thus not required for the electrical function of the electrical component.

By "lateral" is here meant in the plane of the layer or in a direction in a plane parallel to the major surfaces of the layer, as opposed to a vertical or orthogonal direction.

By "flexible substrate" is here meant capable of significant bending, such as following the curvature of a curved object, e.g. a drum, comparatively easily and without breaking, as opposed to a rigid substrate, such as of silicon.

By "adapted for at least partially absorbing a lateral dimensional change" is here meant that the buffer layer is made of a material and has dimensions and other characteristics allowing it to absorb the dimensional changes to a sufficient extent.

The at least partial absorption of the lateral dimensional change may comprise absorbing the lateral dimensional change by at least 99%, or by at least 95%, or by at least 90%, or by at least 80%, or by at least 50%, or by at least 30%.

The buffer layer may be adapted for at least partially absorbing the lateral dimensional change by being of a coherent material and having such layer thickness that a lateral dimensional deformation in a top portion of the buffer layer facing the protective layer results in substantially less lateral dimensional deformation in a bottom portion facing the electrically active part, when said lateral dimensional deformation in the upper part is caused by the lateral dimensional change of the protective layer. The difference in lateral deformation between the top and bottom portions may correspond to the absorbed lateral dimensional change. In this embodiment, the buffer layer thus absorbs the lateral dimensional change in the protective layer by the deformation in the upper portion, which strongly reduces force transfer to the underlying layers, including the electrically active part. It is understood that the reduction become stronger by a thicker buffer layer, but that too thick layers often are undesirable for other reasons, as realized by the skilled person.

By "substantially less lateral dimensional deformation in the bottom portion" is typically meant that less than one percent of lateral dimensional deformation in the top portion should manifest as deformation in the bottom portion.

The lateral dimensional deformation in the upper part may be a substantially completely elastic deformation.

The buffer layer preferably comprises, or substantially consists of, a material with a glass transition temperature $T_g$ that is lower than 30 degrees C. or preferably lower than 25 degrees C. A glass transition temperature such low defines a group of materials that has the ability to provide the at least partly absorption of the lateral dimensional change in the protective layer. Such material is typically polymeric and may further provide the buffer layer with ability to also at least partly absorb dimensional changes in a direction perpendicular to a direction of the lateral dimensional change, i.e. may provide the buffer layer with a property to absorb dimensional change in a longitudinal direction, that is, in a "through layer" direction. Such absorption may also reduce impact from the above-mentioned microscopic explosions by providing a buffer means for the explosive forces and vertical deformations that else would be confined only to the electrically active part by the protective layer. Compare e.g. to the situation with an explosion of same strength in a small or in a spacious room, or in a can with or without a lid. Hence, if the "lateral absorption" may reduce the risk of high field strength fragments or structures to form in a first place, i.e. embryos that may cause the microscopic explosions, the "vertical absorption" reduces the risk of such fragments or structures that nevertheless are formed, or that are already present of other reasons, to cause short circuit.

The material of the buffer layer may be a hybrid material comprising at least one material component that has a glass transition temperature $T_g$ that is lower than 30 degrees C. or preferably lower than 25 degrees C.

By "hybrid material" is here meant a material that comprises more than one material component, where the components typically have distinguishable glass transition temperature peaks. Said at least one material component may be a material component that connects material pieces of another material component that have higher glass transition temperature, which e.g. may be above 30 degrees C.

The at least one material component may constitute at least 50%, or at least 80%, or at least 90%, of the hybrid material. The hybrid material may have several glass transition temperatures, one for each material component. The at least one material component with a glass transition temperature of less than 30 degrees C., may constitute a dominant part of the hybrid material. The buffer layer as whole may thereby get the desired properties.

The buffer layer may comprise, or substantially consist of, a material with a glass transition temperature ($T_g$) that is higher than −130 degrees C. or preferably higher than −90 degrees C.

The buffer layer may comprise, or substantially consist of, a material or mix of two or more materials from any one of the following: silicon rubber, natural rubber, polypropylene glycol, polyvinyl acetate and acrylate based resins.

The buffer layer may have a thickness in a range of 1 to 40 μm.

The ferroelectric memory material layer may comprise an organic, preferably polymeric, ferroelectric memory material.

The lateral dimensional change of the protective layer may be such causable by hardening of the protective layer, such as by curing, or by temperature differences in an operational temperature interval of the ferroelectric memory cell, such as −10 C to +50 C. The lateral dimensional change of the protective layer may be about or below 3%, preferably about or below 2%, more preferably about or below 1%, in any lateral direction.

The electrically active part and/or the buffer layer may have been printed on the flexible substrate.

The protective layer may be directly attached to the buffer layer. It should be noted that it in some embodiments may be an intermediate layer or layers arranged between the buffer layer and the protective layer.

The protective layer may comprise a material that has been hardened, such as by means of curing, after it has been deposited on the stack.

The protective layer may comprise a protective film and an adhesive attaching the protective film to the buffer layer, wherein the adhesive may be the material that has been hardened.

The protective layer may be in the form of a protective film and the buffer layer may form an adhesive attaching the protective film to the rest of the stack.

The buffer layer may be formed of a non-coherent material confined between the protective layer and the top electrode layer.

By "non-coherent material is here meant that the material consists of elements that are not or so weakly bound to each other that it is possible to move some particles in one surface of the layer without causing movement of, or cause a force to act upon, elements in the opposite surface. Hence, any force, such as caused by lateral dimensional change in the protective layer, acting upon elements in a buffer layer surface facing the protective layer, may move those particles and possibly some neighbour particles, but will not result in any significant force acting upon a particle in an opposite surface of the buffer layer, and thus no, or reduced, force from lateral dimensional change of the protective layer will load the underlying layers. The non-coherent material will thus absorb any lateral dimensional change in the protective layer.

The non-coherent material is may be a gas, and the buffer layer may correspond to a gas filled gap, such as a gap filled with carbon dioxide or an air-gap.

According to a second aspect there is provided use of a buffer layer for reduction of short circuits in a ferroelectric memory cell, where the buffer layer and the ferroelectric memory cell may be such as discussed in the foregoing.

According to a third aspect there is provided use of a material with a glass transition temperature $T_g$ that is lower than 30 degrees C., or preferably lower than 25 degrees C., for forming a buffer layer for reduction of short circuits in a ferroelectric memory cell. The buffer layer and the ferroelectric memory cell may be such as discussed in the foregoing.

According to a fourth aspect there is provided a method for producing a ferroelectric memory cell comprising a stack of layers arranged on a flexible substrate where said method comprises: providing said substrate and arranged thereon an electrically active part of said stack, where the electrically active part comprises a bottom electrode layer and a top electrode layer separated by at least one ferroelectric memory material layer; and providing a protective layer for protecting the electrically active part against scratches and abrasion. Wherein the method further comprises one or both of the following steps: providing a buffer layer on top of said electrically active part of said stack before providing the protective layer, wherein the buffer layer may be such as discussed in the foregoing, and/or electrically operating the electrically active part before providing the protective layer.

When electrically operating the electrically active part, small fragments or structures that have been formed in the electrically active part, e.g. owing to an uneven substrate or other imperfections, may receive so high electric field strength that there literally will be microscopic explosions in the electrically active part, as discussed in the foregoing. If a hard protection layer at that point is present, the micro explosions are taken part in a rather small volume and are confined to the electrically active part, resulting in increased damage and increased risk of shorts to occur. If the micro explosions are triggered without presence of the protective layer, the damage may become is less and thereby there is less risk of shorts to occur. The buffer layer, as discussed above, may reduce the risk of micro explosion embryos to form in a first place. The buffer layer, owing to that it is must typically be made of a much softer material than the protection layer, may also act as a buffer for micro explosions that are nevertheless taking part, reducing the damage such micro explosions may have on the electrically active part.

The step of providing the protective layer may involve depositing a layer in a fluid form and subsequently hardening the deposited layer, such as by curing. If providing the protective layer involves subsequent hardening, the step of electrically operating may be performed after deposition but before the hardening. Only after it has hardened the protective layer may direct the effect of any micro explosion towards the electrically active part and result in a more closed volume in which any microscopic explosion may cause greater damage.

The electrically active part and/or the buffer layer and/or the buffer layer may be provided by printing processes.

According to a fifth aspect there is provided a memory device comprising one or more memory cells as discussed in the foregoing, preferably a passive matrix memory device.

BRIEF DESCRIPTION OF THE DRAWINGS

The above, as well as other aspects, objects and advantages of the present invention, will be better understood through the following illustrative and non-limited detailed description, with reference to the appended schematic drawings.

FIG. 2c schematically illustrates deformation in a buffer layer of the memory cell according to the embodiment in FIG. 2a.

In the drawings the same reference numerals may be used for same, similar or corresponding features, even when the reference numerals refer to features in different embodiments.

DETAILED DESCRIPTION

Figure 1A:
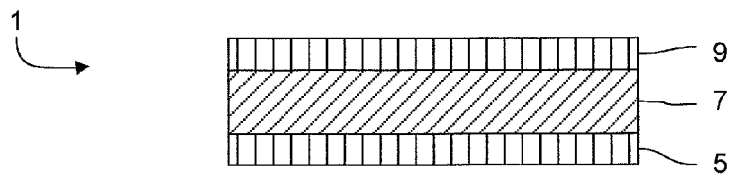
FIG. 1a schematically illustrates a cross section view of an exemplifying prior art memory cell.
Figure 1B:
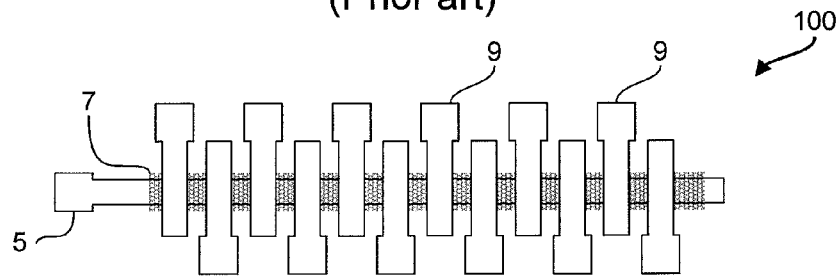
FIG. 1b schematically shows a top view of an exemplifying prior art memory device comprising an array of memory cells.
Figure 1C:
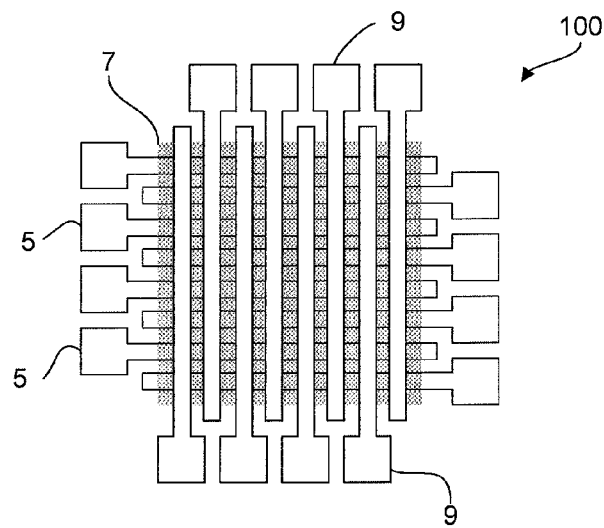
FIG. 1c schematically illustrates a top view of an exemplifying prior art memory device comprising memory cells arranged in a matrix.

FIG. 1a schematically illustrates a cross section view of an exemplifying prior art memory cell 1, illustrating a generic structure of such memory cell. The memory cell in question comprises a pair of electrodes in the form of layers 5,9 contiguous to a volume of an electrically polarizable substance, typically in the form of a ferroelectric memory material layer 7. Typically the memory cell 1 has a parallel-plate capacitor-like structure as shown. This simple structure is in strong contrast to memory cells in traditional memory technologies, where one or more transistors or other semiconducting elements are required in association with each cell, and the consequences for low cost manufacturing are dramatic. A plurality of such memory cells 1 may be arranged side by side on a common substrate (not shown in FIG. 1a), each cell having the generic structure shown in FIG. 1a, where electrical access to each cell may be by wire connection to each of the two electrodes. Depending on the application, the size, shape, spatial distribution, and electrical connection arrangement for a plurality of memory cells 1 may vary. In cases where a memory device 100 as shown in FIGS. 1b-c involves a large number of memory cells, a matrix or array of memory cells 1 provides a simple and compact means of providing electrical access to individual cells 1 for writing, reading, and erasing operations. This memory device configuration is often termed a passive matrix device since there are no switching transistors present for switching a memory cell on and off in an addressing operation. Basically a memory device 100 of this kind is formed with a first pattern of parallel strip-like electrodes, corresponding to bottom electrodes 5, which is located on a common substrate (not shown) and covered by a global layer of ferroelectric memory material 7 e.g. a ferroelectric polymer, over which is provided another electrode pattern comprising likewise parallel strip-like electrodes, corresponding to top electrodes 9, but oriented orthogonally to the first electrode pattern, so as to form an orthogonal electrode matrix. The ferroelectric memory material may also be applied as a non-continuous layer, i.e. a pattern, forming a layer at each individual memory cell but not globally. The first electrode pattern, or set of electrodes 5, can e.g. be regarded as the word lines of a matrix-addressable memory device, while the second electrode pattern, or set of electrodes 9, can be regarded as the bit lines thereof. At the crossings between the word lines and bit lines, the memory cells 1 are defined in the matrix, each cell 1 thus having a vertical, or stacked structure as shown in FIG. 1a, comprising a bottom electrode layer 5 and top electrode layer 9 with a ferroelectric memory material layer 7 in-between. Each memory cell is laterally confined by the electrode crossing area, or, in case of a patterned memory material layer, by the lateral extension of the memory material at such crossing.

FIG. 1b schematically shows a top view of an exemplifying prior art memory device 100 comprising an array of memory cells 1, each having the cross-sectional structure described above in connection with FIG. 1a. There is one common bottom electrode 5, but each memory cell has a separate top electrode 9. The memory material is provided as a global layer 7 between the bottom and top electrodes, each memory cell 1 being formed at the crossing between the bottom electrode 5 and the respective top electrode 9. The electrodes may as shown be drawn to outside the area where the memory cells 1 are located, and a respective contact pad may be located at the end of each electrode for external electrical contacting of the electrodes, for example in order to read and/or write the memory cells by means of external circuitry.

FIG. 1c schematically illustrates a top view of an exemplifying prior art memory device comprising memory cells 1 arranged in a matrix. The structure is an extension of the structure shown in FIG. 1 b, with multiple parallel bottom electrodes 5 in addition to the top electrodes 9, each electrode being common for all memory cells 1 in a row or column. The memory material is provided as a global layer 7 between the top and bottom electrodes 5,9 and respective memory cell 1 is formed at the crossings of the bottom and top electrodes 5,9.

Figure 1D:
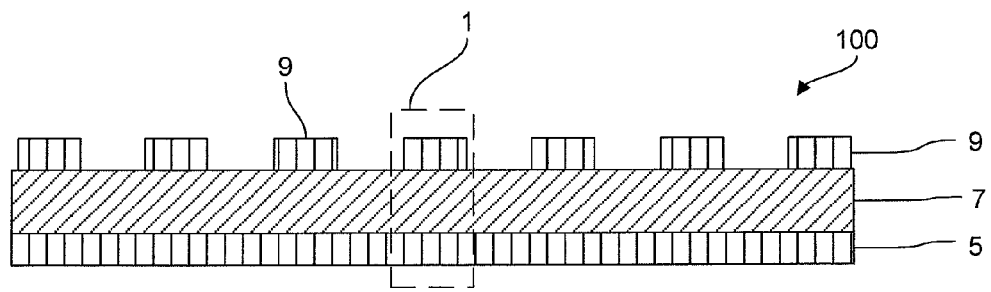
FIG. 1d schematically illustrates a cross section view of the memory device shown in FIG. 1b or 1c.

FIG. 1d schematically illustrates a cross section view of a memory device 100 as shown in FIG. 1 b or 1c, one memory cell 1 being highlighted and marked with a dashed square to facilitate comparison with the generic structure shown in FIG. 1a.

The arrayed memory cells 1 on a given substrate may be electrically accessed from external circuitry, e.g. by means of mechanical contacts pads on the substrate. Such solutions are e.g. disclosed in WO2006/135247 and WO2006/135245. Alternatively, there may be active electrical circuitry incorporated on or in the substrate itself. The circuitry may be located in thin film semiconducting material based on silicon (amorphous or polycrystalline) or organic materials (polymers or oligomers). When the memory cells are printable, for example such as described in WO2006/13524, the circuitry is preferably printable as well.

Substrates, onto which the memory cells discussed above and in the following are typically flexible. They may be electrically insulating, e.g. in the form of a sheet of paper, a plastic foil, glass, board, carton or a composite material of any of these materials. Alternatively, they may be electrically conducting, e.g. in the form of a metal foil with an insulating coating to avoid electrical short circuits.

Electrodes discussed above and in the following may be of metal, preferably from printable metal inks, but can alternatively be e.g. conducting organic material, such as of a conducting polymer, e.g. PEDOT, preferably also printable. Also other organic or inorganic materials may be used and preferably such that are printable.

The ferroelectric memory material discussed above and in the following, is preferably organic, such as one of an oligomer, copolymer, or terpolymer, or a blend or composites thereof. It may preferably be a copolymer of polyvinylidene fluoride and trifluoroethylene (P(VDF-TrFE)).

Memory cells 1 and memory devices 100 according to various embodiments will be discussed in the following. As will be recognized, the embodiments may be viewed upon as extended versions of the memory cells 1 and memory devices 100 discussed in the foregoing, where the memory cells and devices discussed in the foregoing correspond to electrically active parts of the embodiments.

Figure 2A:
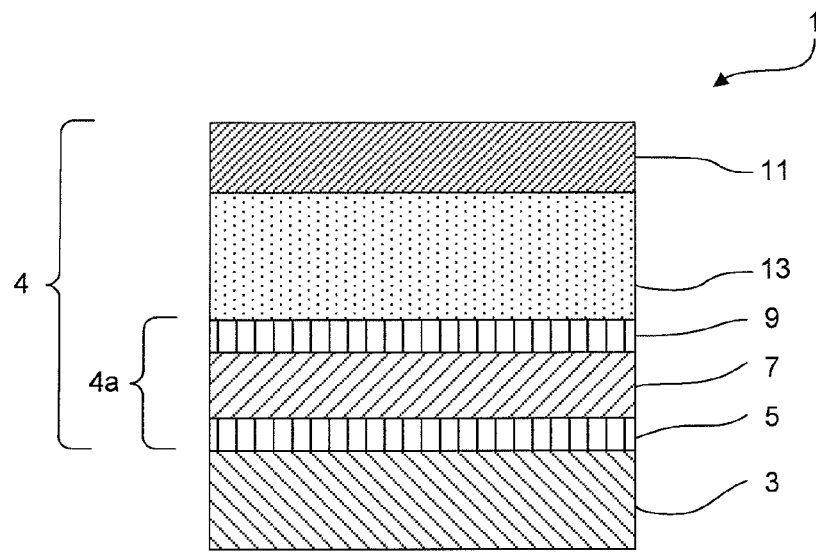
FIG. 2a schematically shows a cross section of a memory cell according to one embodiment having reduced risk of shorts to occur.

FIG. 2a schematically shows a cross section of a memory cell 1 according to one embodiment having reduced risk of shorts to occur. The memory cell comprises a stack 4 of layers on a flexible substrate 3. The flexible substrate 3 may have a thickness in a range of about 10 μm to 300 μm. The flexible substrate 3 is preferably made of any one of: Polyethylene Naphthalate (PEN), Polyethylene Terephthalate (PET), Polyimide, Polyether (PE), Polyvinyl chloride (PVC), Polycarbonate (PC), Polyethylene (PE), or the like. The stack 4 of layers comprises an electrically active part 4a which is the part that provides the electrical function, here the electrical function of the memory cell 1. The electrically active part 4a may correspond to a prior art memory cell 1 as discussed above in connection with FIG. 1.

Figure 2B:
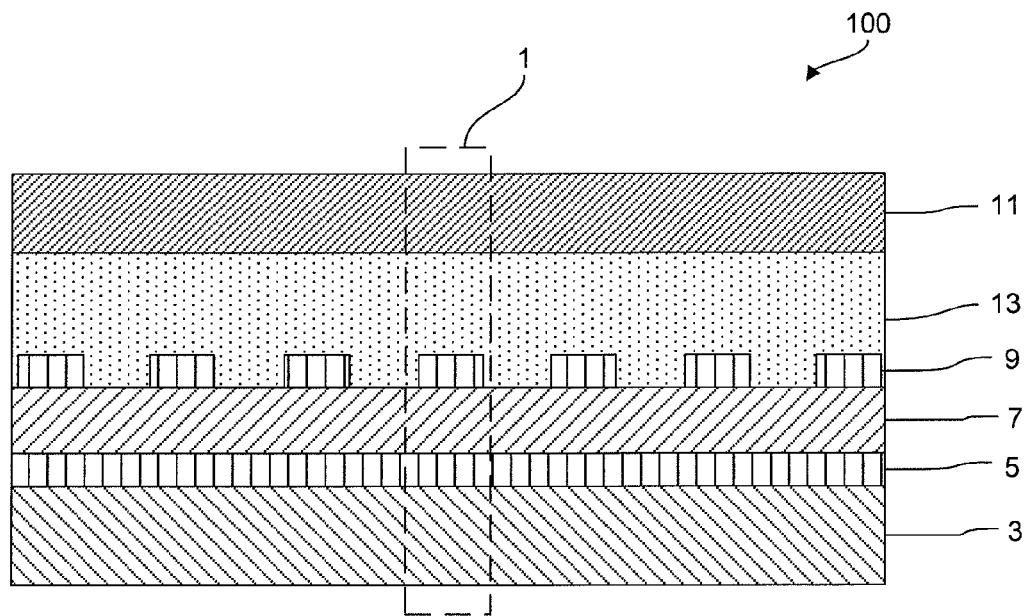
FIG. 2b schematically shows a cross section of a memory device according to one embodiment.

FIG. 2b schematically shows a cross section of a memory device 100 according to one embodiment, the memory device 100 comprising memory cells 1 that may correspond to the memory cell 1 of FIG. 2a. The shown memory device has a bottom electrode 5 that is shared between memory cells 1 and a plurality of top electrodes 9, each of which also may be shared between memory cells 1, although not shown in the cross section view of FIG. 2b. The memory device may also have a plurality of parallel bottom electrodes 5, although this neither is shown in the cross section view of FIG. 2b. Between the electrodes 5, 9 there is arranged a ferroelectric memory layer 7, typically a ferroelectric organic, such as polymeric, memory material, preferably as a global layer, that is, a layer shared between typically all memory cells 1 of the memory device 100. The memory device 100 may have electrodes 5, 9 and a memory layer 7 correspondingly arranged as shown in FIGS. 1b-d.

The stack 4 of layers in a memory cell 1, e.g. as shown in FIGS. 2a-b, further comprises a protective layer 11. The protective layer 11 is adapted to protect the electrically active part 4a from environmental and/or physical damage, such as scratches and abrasion. To accomplish this, the protective layer typically needs to have a hard outer surface, e.g. by being of a material that is hard, typically significantly harder than other materials in the stack 4. The protective layer 11 may be hardened, such as by curing, after deposition in a fluid state. The protection layer 11 may be a UV curable varnish that is cured by means of UV radiation. The hardening process may cause the protective layer 11 to laterally shrink and the shrinkage may be in the range of one or a few percent. The protective layer 11 is preferably provided as a global layer. The protective layer 11 typically has a thickness in a range of 2 μm to 20 μm. Between the top electrode layer 9 and the protective layer 11 there is arranged a buffer layer 13. The buffer layer 13 is configured to absorb lateral dimensional change that may occur in the protective layer 11, e.g. such caused by shrinkage from curing of the protective layer or by temperature variations.

Figure 2C:
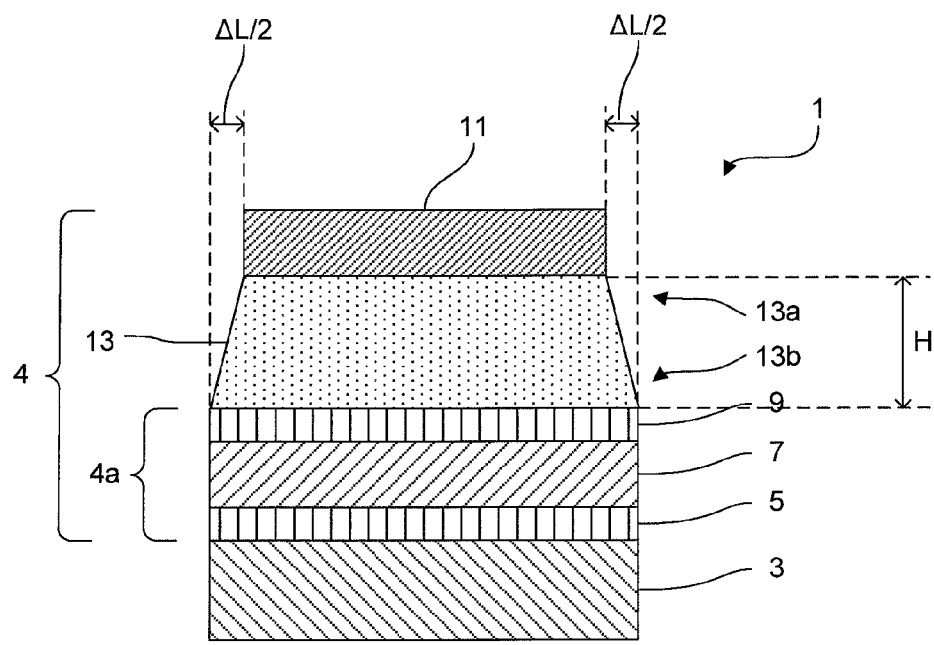

FIG. 2c schematically illustrates deformation in a buffer layer of the memory cell 1 according to the embodiment in FIG. 2a. As illustrated, a top portion 13a of the buffer layer 13 is attached to the protective layer 11 and a bottom portion 13b of the buffer layer 13 is attached to the top electrode layer 9. Curing of the protective layer 11 may result in a lateral dimensional change ΔL of a protective layer portion which before the dimensional change was covering the lateral area of the memory cell 1. When there is a lateral dimensional change lateral dimensional change ΔL in the protective layer, the top portion 13a of the buffer layer 13 may deform correspondingly as shown in FIG. 2c. However, owing to softness of the buffer layer 13, the bottom portion 13b of the buffer layer 13, that is, where the buffer layer is attached to the top electrode layer 9, may be virtually unaffected by the lateral dimensional change ΔL of the protective layer.

The buffer layer 13 thereby absorbs the lateral dimensional change ΔL such that it substantially does not reach and affect the top electrode layer 9, or only to a reduced extent. The buffer layer 13 has a thickness or height H. The ability of the buffer layer 13 to absorb lateral dimensional changes may depend on the thickness H of the buffer layer 13 and material properties. Although very thick buffer layers may be at least theoretically possible to use, it is often desirable or required, e.g. of manufacturing or application reasons, not to use too thick buffer layers. The buffer layer 13 typically has a thickness H in a range of 2 to 20 μm. A buffer layer 13 having desired properties may be accomplished by letting the buffer layer comprise, or consist, of a material that has a glass transition temperature $T_g$ below room temperature, i.e. below about 25 degrees C. or below about 30 degrees C., and preferably above about −130 degrees C. or above about −90 degrees C.

Such range defines a large number of polymeric materials that have suitable material properties. A polymer material with such $T_g$ has an elasticity that enables absorption of a lateral dimension change ΔL as described in connection with FIG. 2c. One specific example of such suitable polymer is polypropylene glycol (PPG), which is also printable. Other examples include silicon rubber, natural rubber, polyvinyl acetate and acrylate based resins.

A buffer layer material with $T_g$ in the described ranges may further provide ability to absorb deformation in a "through layer" direction, that is, perpendicular to the lateral direction. Vertical dimensional changes or irregularities in the top electrode layer 9 can thereby be absorbed by the buffer layer 13.

Figure 3:
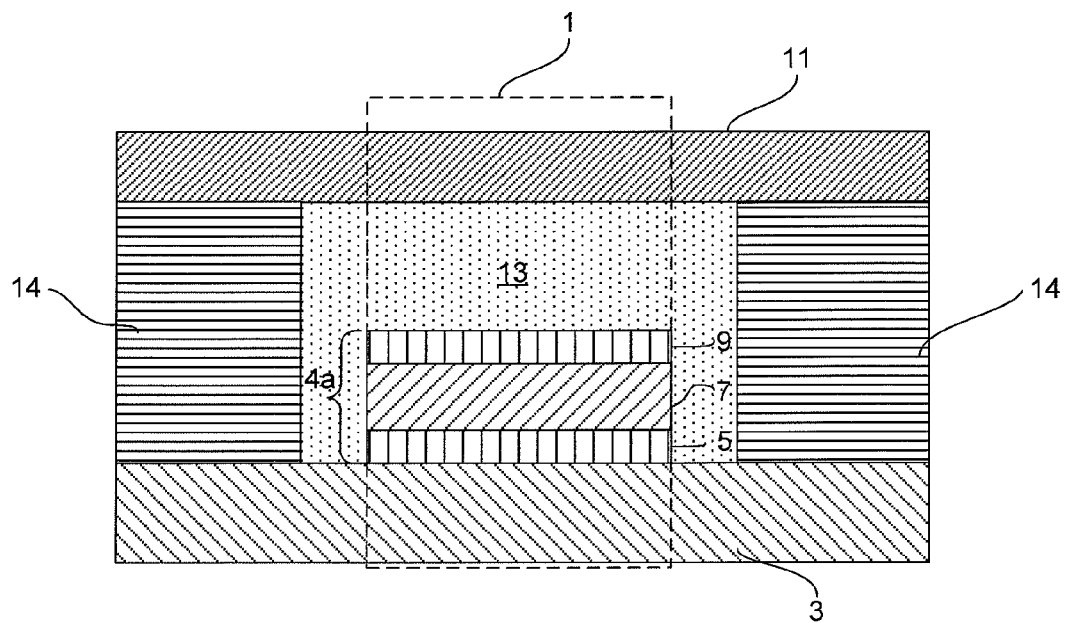
FIG. 3 schematically shows a cross section of a memory cell according to another embodiment having reduced risk of shorts to occur.

FIG. 3 schematically shows a cross section of a memory cell 1 according to another embodiment having reduced risk of shorts to occur. Corresponding to the previously discussed memory cell embodiments, the memory cell 1, marked out by dashed lines, also here comprises a stack of layers arranged on a flexible substrate 3. The electrically active part 4a of the memory cell 1, that is, layers 5,7,9 may be in accordance what has been discussed above. There is also a here a protective layer 11 for protecting the electrically active part against scratches and abrasion. The protective layer is suspended above the top electrode layer 9 by spacers 14 arranged on the substrate 3 on opposite sides of the electrically active part 4a. In a gap provided by the suspension there is confined a non-coherent material forming a buffer layer 13. The non-coherent material may preferably be a gas, for example carbon dioxide. The buffer layer 13 may in this embodiment thus correspond to a gas filled gap, such as a gap filled with carbon dioxide or an air-gap. Also other non-coherent material, which typically are such having very low glass transition temperatures Tg, may be used, not only materials that are in gas phase at room temperature. Non-coherent materials may have glass transition temperatures that are significantly lower than Tg of the materials discussed in connection with the previously discussed embodiment, which involved coherent buffer layer materials. The spacers 14 may be strips of tape, e.g. arranged parallel to electrodes of a memory device of array or matrix type, or strips that are printed. In other embodiments the spacers 14 may be printed dots. In alternative embodiments the spacers may be arranged not directly on the substrate 3, but on any one of other layers 5,7,9 of the memory cell 1, which extends outside the area of the memory cell 1, for example on a globally provided ferroelectric memory material layer 7 in a memory device 100 of array or matrix type. The non-coherent material may be kept in place laterally by e.g. spacers arranged outside the memory cell area of a memory device 100, which spacers may circumvent the memory cell area and provide sealing between e.g. the substrate 3 and the protective layer 11 which is sufficiently tight for keeping the non-coherent material in place. The protective layer is preferably in the form of a protective hard film in this embodiment, which e.g. may be attached by glue or by clamping. Examples of such protective film includes e.g. protective films that are commonly used to protect touch screens of smart phones, kapton tape, and similar.

Another solution that has been found to the problem of reducing the risk of shorts to occur, and which may be used in combination with the buffer layer discussed above, is to initialize (electrically switch) the memory cells before the protection layer is provided, or at least before it is hardened after deposition. Experiments have clearly demonstrated that such initialization may decrease the risk of shorts to occur.

Figure 4:
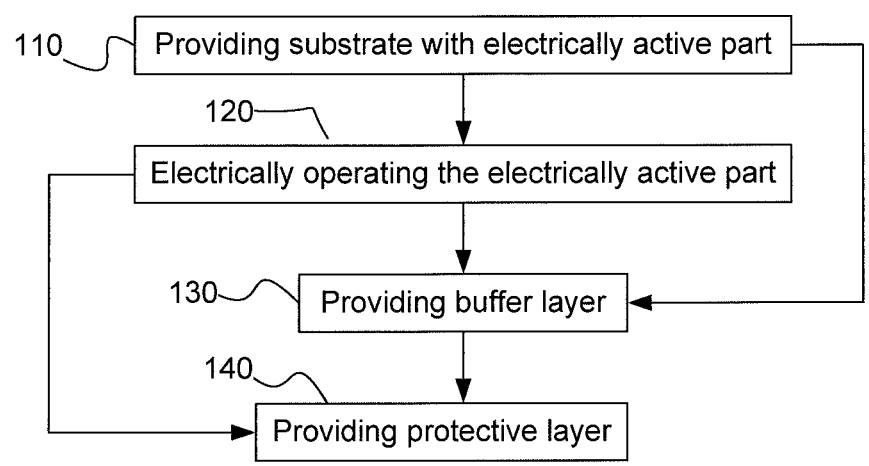
FIG. 4 is a flow chart illustrating a method for reducing the risk of short circuits to occur in a ferroelectric memory cell.

FIG. 4 is a flow chart illustrating a method for producing a memory cell 1 comprising a stack 4 of layers arranged on a flexible substrate 3, which may a memory cell as discussed in the foregoing. In a step 110 there is provided a substrate 3 and arranged thereon an electrically active part 4 of said stack, the electrically active part 4a comprising a bottom electrode layer 5 and a top electrode layer 9 separated by at least one ferroelectric memory material layer 7. The electrically active part may be printed, for example as disclosed in WO2006/135246. In a step 140 a protective layer 11 for protecting the electrically active part against scratches and abrasion is provided. The electrically active part 4a may in a step 120 be electrically operated before providing the protective layer 11. Electrically operating the electrically active part here involves switching polarity in the ferroelectric memory material layer 7 which involves applying voltages of opposite polarity and of magnitudes greater than a coercive voltage of the ferroelectric memory material. The number of switch cycles may be in the order of 100, e.g. 300. Providing the protective layer 11 may involve depositing a layer in a fluid form and subsequently hardening the deposited layer, such as by curing. If providing the protective layer 11 involves subsequent hardening, the step 120 of electrically operating may be performed after deposition but before the hardening. In a step 130 a buffer layer 13 may be provided on top of said electrically active part 4b of said stack before providing the protective layer 11, wherein the buffer layer 13 may be a buffer layer as discussed in the foregoing. Step 120 and 130 are both being performed in some embodiments, while in other embodiments step 120 may be performed but not step 130, and in yet other embodiments, step 130 is performed but not step 120. In one embodiment the method involves printing of the electrically active part. The method may also involve printing of the buffer layer.

In a detailed example, a memory device comprising memory cells according to one embodiment, is produced according to the following: A 50 μm thick substrate 3 is made of PET (e.g. Toray XG532), on top of which a 100 nm thick (patterned) bottom electrode layer 5 of Ag (e.g. Inktec TEC-RA2) is gravure printed. A 150 nm thick ferroelectric memory material layer 7 of P(VDF/TrFE) is micro gravure coated (as a global layer) on the bottom electrode layer and then a 100 nm thick (patterned) top electrode layer 9 of Ag (e.g. Inktec TEC-RA2) is gravure printed thereon. On the top electrode layer a 10 μm thick buffer layer 13 of (silane-terminated) PPG is screen printed (as a global layer). The stack 4 of layers on the substrate 3 is then terminated by a 5 μm thick protective-layer 11 of UV curable varnish (Sun Chemical UV6630) is screen printed (as a global layer) and subsequently cured. The lateral area of each memory cell of the memory device is about 200 μm×200 μm.

Any illustration and description in the drawings and in the foregoing description are to be considered exemplary and not restrictive. The invention is not limited to the disclosed embodiments.

For example, there may be embodiments with one or more intermediate or interface layers between any of the layers in described stack and/or substrate. For example, there may be one or more functional intermediate layers between the electrodes and the memory material, e.g. in order to promote adhesion or reduce detrimental phenomena related to the memory material used and/or the passive matrix addressing.

The present invention is defined by the claims and variations to the disclosed embodiments can be understood and effected by the person skilled in the art in practicing the claimed invention, for example by studying the drawings, the disclosure, and the claims. Use of the word "comprising" in the claims does not exclude other elements or steps, and use of the article "a" or "an" does not exclude a plurality. Occurrence of features in different dependent claims does not per se exclude a combination of these features. Any method claim is not to be construed as limited merely because of the presentational order of the steps. Any possible combination between independent steps of any method claim shall be construed as being within scope, although the independent steps, by necessity must, occur in some order. Any reference signs in the claims are for increased intelligibility and shall not be construed as limiting the scope of the claims.

The invention claimed is:

1. A ferroelectric memory cell comprising a stack of layers arranged on a flexible substrate, wherein said stack comprises an electrically active part and a protective layer for protecting the electrically active part against scratches and abrasion, wherein said electrically active part comprises a bottom electrode layer and a top electrode layer and at least one ferroelectric memory material layer between said electrodes, wherein the stack further comprises a buffer layer, arranged between the top electrode layer and the protective layer, the buffer layer being adapted for at least partially absorbing a lateral dimensional change occurring in the protective layer and thus preventing said dimensional change from being transferred to the electrically active part, wherein the buffer layer is adapted for at least partially absorbing the lateral dimensional change by being of a coherent material and having such layer thickness that a lateral dimensional deformation in a top portion of the buffer layer facing the protective layer results in substantially less lateral dimensional deformation in a bottom portion facing the electrically active part, when said lateral dimensional deformation in the upper part is caused by the lateral dimensional change of the protective layer, the difference in lateral deformation between the top and bottom portions corresponding to absorbed lateral dimensional change.

2. The ferroelectric memory cell as claimed in claim 1, wherein at least partially absorbing the lateral dimensional change comprises absorbing the lateral dimensional change by at least 30%.

3. The ferroelectric memory cell as claimed in claim 1, wherein the buffer layer comprises a material with a glass transition temperature that is lower than 30 degrees C.

4. The ferroelectric memory cell as claimed in claim 3, wherein the material is a hybrid material comprising at least one material component that has a glass transition temperature that is lower than 30 degrees C.

5. The ferroelectric memory cell as claimed in claim 1, wherein the buffer layer comprises a material or mix of two or more materials from any one of the following:
   silicon rubber, natural rubber, polypropylene glycol, polyvinyl acetate and acrylate based resins.

6. The ferroelectric memory cell as claimed in claim 1, wherein the ferroelectric memory material layer comprises an organic, preferably polymeric, ferroelectric memory material.

7. The ferroelectric memory cell as claimed in claim 1, wherein said lateral dimensional change of the protective layer is such causable by hardening of the protective layer, such as by curing, or by temperature differences in an operational temperature range of the ferroelectric memory cell, such as −10C to +50C.

8. The ferroelectric memory cell as claimed in claim 1, wherein the electrically active part and/or the buffer layer has been printed on the flexible substrate.

9. The ferroelectric memory cell as claimed in claim 1, wherein the protective layer is directly attached to the buffer layer.

10. The ferroelectric memory cell as claimed in claim 1, wherein the protective layer comprises a protective film and an adhesive attaching the protective film to the buffer layer, the material that has been hardened being the adhesive.

11. The ferroelectric memory cell as claimed in claim 1, wherein the protective layer is a protective film and the buffer layer forms an adhesive attaching the protective film to the rest of the stack.

12. The ferroelectric memory cell as claimed in claim 1, wherein the top electrode layer comprises a top surface which faces the protective layer, and wherein the buffer layer extends along the entire top surface of the top electrode layer in the ferroelectric memory cell.

13. A memory device comprising one or more memory cells as claimed in claim 1, preferably a passive matrix memory device.

* * * * *